(12) United States Patent
Bruce et al.

(10) Patent No.: US 6,483,327 B1
(45) Date of Patent: *Nov. 19, 2002

(54) QUADRANT AVALANCHE PHOTODIODE TIME-RESOLVED DETECTION

(75) Inventors: Michael R. Bruce, Austin, TX (US); Victoria J. Bruce, Austin, TX (US); Jeffrey D. Birdsley, Austin, TX (US); Rosalinda M. Ring, Austin, TX (US); Rama R. Goruganthu, Austin, TX (US); Brennan V. Davis, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/409,088

(22) Filed: Sep. 30, 1999

Related U.S. Application Data

(63) Continuation-in-part of application No. 09/205,589, filed on Dec. 4, 1999.

(51) Int. Cl.$^7$ .......................... G01R 31/302; G01R 1/04; H01H 31/02
(52) U.S. Cl. ..................... 324/752; 324/537; 324/158.1
(58) Field of Search ................... 324/537, 752, 324/158.1; 359/197, 212, 238, 239; 356/338, 342, 445, 447, 448; 250/338.1, 338.4, 339.02, 341.4, 370.01, 370.1

(56) References Cited

U.S. PATENT DOCUMENTS

| 5,412,328 | A | * | 5/1995 | Male et al. | 324/752 |
| 5,451,863 | A | * | 9/1995 | Freeman | 324/752 |
| 5,550,479 | A | * | 8/1996 | Wakana et al. | 324/752 |
| 5,631,571 | A | * | 5/1997 | Spaziani et al. | 324/752 |
| 5,663,652 | A | * | 9/1997 | Freeman | 324/752 |

OTHER PUBLICATIONS

Zappa, F., Lacaita, A., Cova, S., and Lovati, P., *Counting, Timing, and Tracking with a Single–Photon Germanium Detector*, 1996, Optical Society of America, pp. 59–61.

EG&G Optoelectroncs, *Silicon APD Arrays Quadrant and Linear 400nm to 1100nm*, Sep. 1999, pp. 1–3.

(List continued on next page.)

Primary Examiner—Michael Sherry
Assistant Examiner—Jermele Hollington (57) ABSTRACT

A method and system providing spatial and timing resolution for photoemission microscopy of an integrated circuit. A microscope having an objective lens forming a focal plane is arranged to view the integrated circuit, and an aperture element having an aperture is optically aligned in the back focal plane of the microscope. The aperture element is positioned for viewing a selected area of the integrated circuit. A position-sensitive avalanche photo-diode is optically aligned with the aperture to detect photoemissions when test signals are applied to the integrated circuit.

22 Claims, 6 Drawing Sheets

OTHER PUBLICATIONS

Kash, J., Tsang, J., Knebel, D., and Vallett, D., *Non–invasive Backside Failure Analysis of Integrated Circuits by Time–dependent Light Emission: Picosecond Imaging Circuit Analysis,* Nov. 1998, pp. 1–6.

Knebel, D., Sanda, P., McManus, M., Kash, J., Tsang, J., Vallett, D., Huisman, L., Nigh, P., Rizzolo, R., Song, P., and Motika, F., *Diagnosis and Characterization of Timing–Related Defects by Time–Dependent Light Emission,* pp. 1–7.

Quantar Technology, Inc., *Domestic Price List Series 2600 Imaging Photon Detector Systems,* Apr., 1997, pp. 1–3.

EG&G Optoelectronics, *X–Y Sensors and Quadrant Detectors,* Sep., 1999, pp. 1–3.

Barton, D., Tangyunyong, P., Soden, J., Liang, A., Low, F., Zaplatin, A., Shivanandan, K., and Donohoe, G., *Infrared Light Emission From Semiconducter Devices,* 1997, pp. 9–17.

Bruce, M., *A Study of Reactive Quenching of Tenon by Chlorides Using Two Photon Laser Excitation,* 1990, pp. 54–64.

Bruce, V., *Energy Resolved Emission Microscope,* 1993, pp. 178–183.

Charbonneau, S., Allard, L., Young, J., Dyck, G., and Kyle, B., *Two–dimensional Time–Resolved Imaging with 100–ps Resolution Using a Resistive Anode Photomultiplier Tube,* 1992, American Institute of Physics, pp 5315–5319.

Cova, S., Lacaita, A., Ghioni, M., Ripamonti, G., and Louis, T., *20–ps Timing resolution with Single–photon Avalanche Diodes,* 1989, American Institute of Physics, pp. 1104–1110.

Cova, S., Lacaita, A., Zappa, F. and Lovati, P., *Avalanche Photodiodes for Near–infrared Photon Counting,* Jan., 1995, pp. 56–66.

Dautet, H., Deschamps, P., Dion, B., MacGregor, A., MacSween, D., McIntyre, R., Trottier, C., and Webb, P., *Photon Counting Techniques with Silicon Avalanche Photodiodes,* 1993, Applied Optics, pp. 3894–3900.

Firmani, C., Ruiz, E., Carlson, C., Lampton, M., and Paresce, F., *High–resolution Imaging with a Two–dimensional Resistive Anode Photon Counter,* 1982, American Institute of Physics, pp. 570–574.

Hawkins, C., Soden, J., Cole, Jr., E., and Snyder, E., *The Use of Light Emission in Failure Analysis of CMOS ICs,* 1997, ASM International, pp. 55–65.

Hu, C., *Hot Carrier Effects,* VLSI Electronics: Microstructure Science, vol. 18, 1989, pp. 119–160.

Hu, C., Tam, S., Hsu, F., Ko, P., Chan, T., and Terrill, K., *Hot–Electron–Induced MOSFET Degradation–Model, Monitor, and Improvement,* Feb. 1985, IEEE, pp. 375–385.

Kash, J., Tsang, J., *Full Chip Optical Imaging of Logic State Evolution in CMOS Circuits,* 1986, pp. 1–3.

Kash, J., Tsang, J., *Hot Luminescence from CMOS Circuits: A Picosecond Probe of Internal Timing,* 1997, pp. 507–516.

Kash, J., Tsang, J., *Dynamic Internal Testing of CMOS Circuits Using Hot Luminescence,* 1997, IEEE, pp. 330–332.

Lacaita, A., Zappa, F., Cova, S., and Lovati, P., *Single–poton Detection Beyond 1 μm: Performance of Commercially Available inGaAs/InP Detectors,* 1996, Applied Optics, pp. 2986–2996.

Lacaita, A., Zappa, F., Birliardi, S., and Manfredi, M., *On the Bremsstrahlun Origin of Hot–Carrier–Induced Photons in Silicon Devices,* 1993, IEEE, pp. 577–582.

Louis, T., Ripamonti, G., and Lacaita, A., *Photoluminescence Lifetime Microscope Spectrometer Based on Time–correlated Single–photon Counting with an Avalanche Diode Detector,* 1990, American Institute of Physics, pp. 11–22.

Mellon, M., *Imaging PMTs Detect in All Dimensions,* Laser Focus World, Mar. 1997, pp. S21–S27.

Tsang, J., and Kash, J., *Picosecond Hot Electron Light Emission from Submicron Complementary Metal–Oxide–Semiconductor Circuits,* 1997, American Institute of Physics, pp. 889–891.

Shade, G., *Physical Mechanisms for Light Emission Microscopy,* 1997, ASM International, pp. 121–128.

EG&G Canada, *Single Photon Counting Module,* 1995, pp. 2–9.

Uraoka, Y., Tsutsu, N., Morii, T., Tsuji, K., *Hot Carrier Evaluation of MOSFET's in ULSI Circuits Using the Photon Emission Method,* 1993, IEEE, pp. 1426–1430.

* cited by examiner

QUADRANT AVALANCHE PHOTODIODE TIME-RESOLVED DETECTION

RELATED PATENT APPLICATIONS

This patent application is a continuation-in-part of the patent application entitled, "SINGLE POINT HIGH RESOLUTION TIME RESOLVED PHOTOEMISSION MICROSCOPY SYSTEM AND METHOD" by Bruce et al., filed on Dec. 4, 1999, and having application Ser. No. 09/205,589.

FIELD OF THE INVENTION

The invention relates to inspection of integrated circuits, and more particularly to inspection of integrated circuits using photo-emissions.

BACKGROUND OF THE INVENTION

The semiconductor industry has seen tremendous advances in technology in recent years, permitting dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

Typically, dies contain a bonding pad which makes the electrical connection to the semiconductor package. To shorten the electrical path to the pad, another packaging technology called flip-chip packaging is employed, where the bonding pads were moved to the side of the die nearest the transistors and other circuit devices formed in the die. Connection to the package is made when the chip is flipped over and soldered. As a result, the dies are commonly called flip chips in the industry. Each bump on a pad connects to a corresponding package inner lead. The packages which result are lower profile and have lower electrical resistance and a shortened electrical path. The plurality of ball-shaped conductive bump contacts (usually solder, or other similar conductive material) are typically disposed in a rectangular array. The packages are occasionally referred to as "Ball Grid Array" (BGA) or "Area Grid Array" packages.

Figure 1:
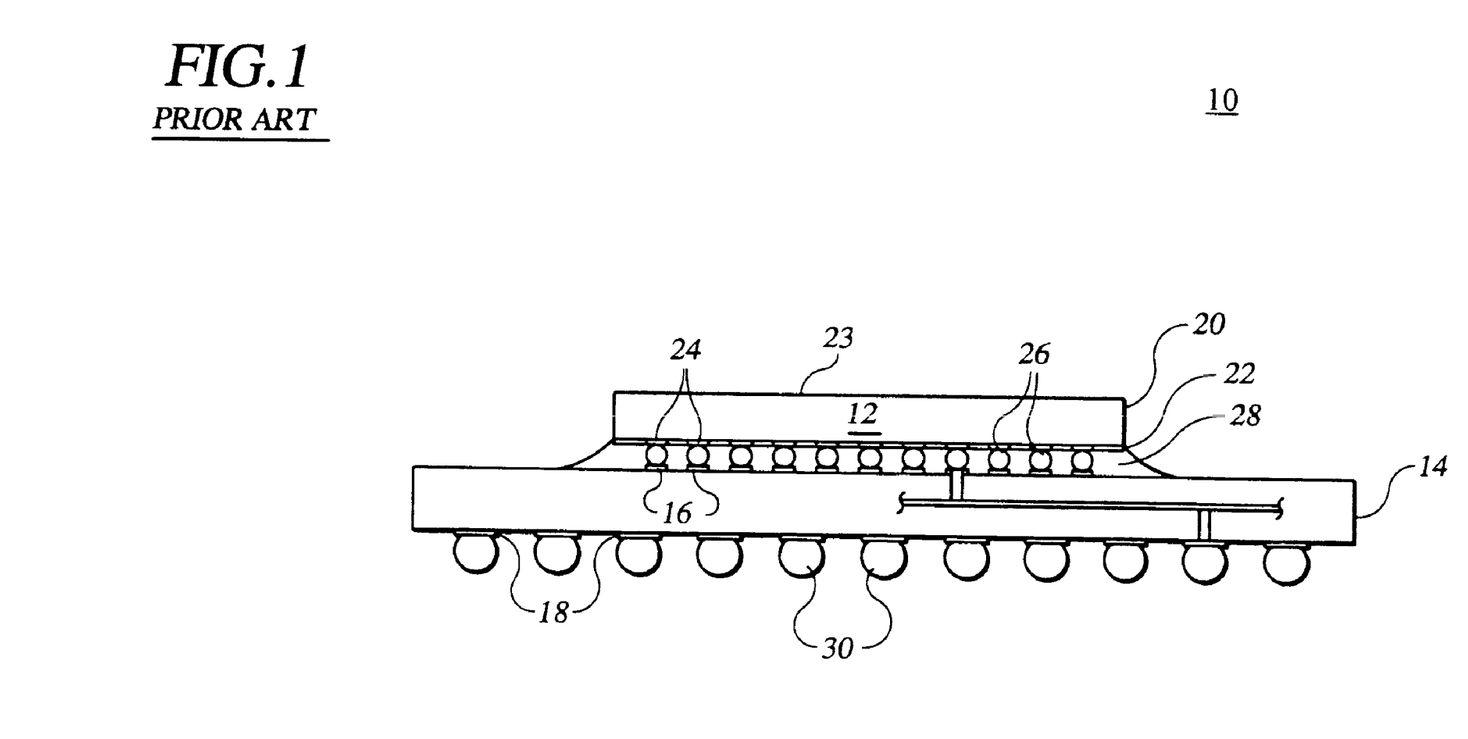
FIG. 1 is a cross-sectional view of an example BGA device. The device includes an integrated circuit mounted upon a larger package substrate.

FIG. 1 is a cross-sectional view of an example BGA device 10. The device 10 includes an integrated circuit 12 mounted upon a larger package substrate 14. Substrate 14 includes two sets of bonding pads: a first set of bonding pads 16 on an upper surface adjacent to integrated circuit 12 and a second set of bonding pads 18 arranged in a two-dimensional array across an underside surface. Integrated circuit 12 includes a semiconductor substrate 20 having multiple electronic components formed within a circuit layer 22 upon a front side surface of semiconductor substrate 20 during wafer fabrication. The back side surface 23 remains exposed after the device 10 is formed. The electronic components are connected by electrically conductive interconnect lines to form an electronic circuit. Multiple I/O pads 24 are also formed within circuit layer 22. I/O pads 24 are typically coated with solder to form solder bumps 26.

The integrated circuit is attached to the package substrate using the controlled collapse chip connection method, which is also known as the C4® or flip-chip method. During the C4 mounting operation, solder bumps 26 are placed in physical contact with corresponding members of the first set of bonding pads 16. Solder bumps 26 are then heated long enough for the solder to reflow. When the solder cools, I/O pads 24 of integrated circuit 12 are electrically and mechanically coupled to the corresponding members of the first set of bonding pads 16 of the package substrate. After integrated circuit 12 is attached to package substrate 14, the region between integrated circuit 12 and package substrate 14 is filled with an under-fill material 28 to encapsulate the C4 connections and provide additional mechanical benefits.

Package substrate 14 includes one or more layers of signal lines that connect respective members of the first set of bonding pads 16 and the second set of bonding pads 18. Members of the second set of bonding pads 18 function as device package terminals and are coated with solder, forming solder balls 30 on the underside surface of package substrate 14. Solder balls 30 allow BGA device 10 to be surface mounted to an ordinary PCB. During PCB assembly, BGA device 10 is attached to the PCB by reflow of solder balls 30 just as the integrated circuit is attached to the package substrate.

The C4 mounting of integrated circuit 12 to package substrate 14 prevents physical access to circuit layer 22 for failure analysis and fault isolation. Thus, new approaches that are efficient and cost-effective are required.

It is well known that CMOS transistors emit photons during a state change, for example, switching the gate of a transistor. Photons are emitted from transistors at pn junctions, for example. These transient events occur on time scales that are less than 100 ps. Thus, in order to record these events, a very fast detector is required. In addition, a very sensitive detector is required for observing very weak emissions through the backside of the semiconductor because of the absorption losses in the silicon substrate. Another aspect of the emission analysis is to spatially resolve the emissions. It is desired to detect emissions from a single transistor where the device dimensions may be sized less than a micron. Therefore, an apparatus and method that provides fast and cost effective spatially and temporally resolved photoemission analysis of semiconductor circuits is desirable.

Various approaches to picosecond imaging circuit analysis (PICA) have been implemented. For example, one apparatus uses a cooled microchannel plate photomultiplier tube (MCP-PMT), with a position sensitive resistive anode to simultaneously image and time-resolve optical emission from individual FETs in submicron CMOS circuits. However, the MCP-PMT is relatively inefficient for wavelengths in the range of 900–1300 nm. That is, the MCP-PMT is not very sensitive to light in this range.

SUMMARY OF THE INVENTION

In various embodiments, methods and systems are provided for time resolved photoemission microscopy for an integrated circuit. In one embodiment an apparatus is provided for analyzing an integrated circuit to which test signals are applied. The apparatus includes a microscope having an objective lens forming a focal plane arranged to view the integrated circuit, and an aperture element having an aperture optically aligned in the back focal plane of the microscope. The aperture element is positioned for viewing a selected area of the integrated circuit. A position-sensitive avalanche photo-diode is optically aligned with the aperture to detect photoemissions when test signals are applied to the integrated circuit.

The above summary is not intended to describe each illustrated embodiment or every implementation of the present invention. The figures and the detailed description which follow more particularly exemplify these embodiments.

BRIEF DESCRIPTION OF THE DRAWINGS

The following detailed description of the preferred embodiments can best be understood when read in conjunction with the following drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to analysis of a variety of semiconductor structures and has been found to be particularly advantageous in analyzing flip-chip structures. While the present invention is not so limited, an appreciation of various aspects of the invention is best gained through a discussion of the example embodiments set forth below in which a flip-chip is analyzed.

Figure 2:
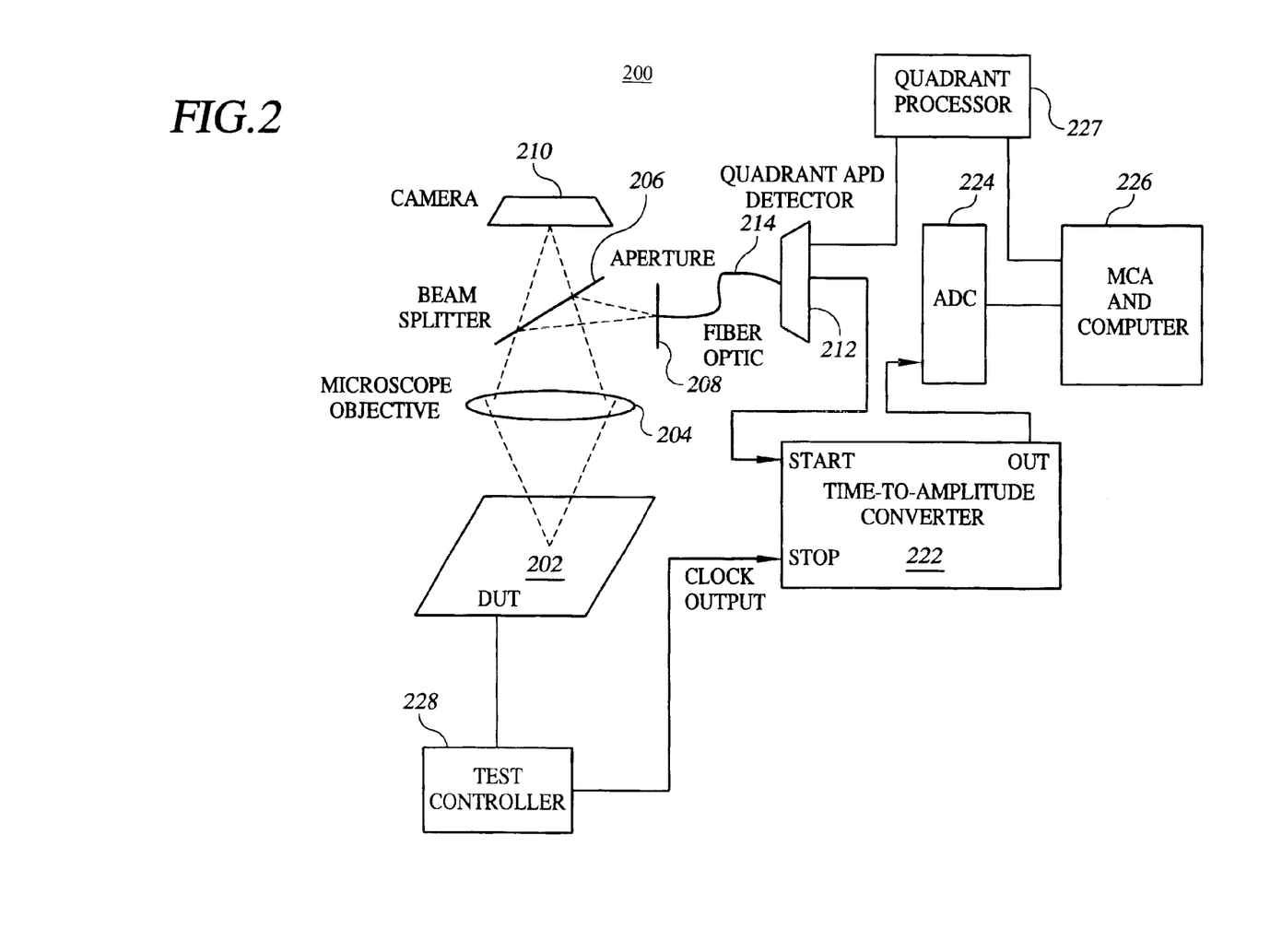
FIG. 2 is a block diagram of an example system for quadrant time-resolved photoemission detection.

FIG. 2 is a block diagram of an example system 200 for single spot time resolved photoemission detection. The integrated circuit undergoing analysis is shown as device under test (DUT) 202. The DUT 202 is positioned in view of microscope objective 204, which in an example embodiment, is part of a laser scanning microscope (not shown) for positioning the DUT 202 to view a selected area of the device. The microscope objective 204 is a near infrared objective to allow viewing through the back side of the DUT 202, for example. While a laser scanning microscope is used in the example embodiment, it will be appreciated that other types of microscopes, such as compound, metallurgical, or emission microscopes can be used to gather photoemissions from the device. For example, the Zeiss Axiotron, Mitutoyo FS60 Finescope, and Olympus VANOX-T may be suitable.

While the embodiments described herein are suitable for back side analysis of integrated circuits, it should be understood that such embodiments are suitable or could be adapted for analysis of the front sides of the integrated circuits. While electron beam systems are commonly used for front side analysis, the embodiments of the present invention may be far more economical.

The beam splitter 206 is a cube-type beam splitter, for example. Other types that are capable of transmitting near infrared (IR) light would also be suitable, such as a Plate beam splitter or a Pellicle Beamsplitter. The beam splitter 206 is positioned behind the objective 204 to direct photoemissions from the DUT 202 to an aperture element 208 and fiber optic bundle, as well as to a photoemission camera 210. Aperture element 208 helps to reduce scattered light. The aperture element 208 has a circular aperture, for example, the FO Adapter, part number 452735 that is available Carl Zeiss. The example aperture element has a diameter to match the diameter of the fiber optic bundle. Thus, no light is sacrificed with the aperture element and no undesirable additional light is gathered. A fiber optic cable with a core diameter matched to detector 212 could also double as an aperture.

The aperture element 208 is optically aligned with the beam splitter 206 so that photoemissions from the DUT 202 are directed toward the opening of the aperture element. The size of the opening of the aperture can be selected in accordance with the size of detector 212.

In another embodiment (not shown), a solid immersion lens (matching the index of refraction of the silicon substrate) could be positioned directly in contact with the surface of the DUT. Such a lens has a finer resolution because minimal air space separates the lens from the device, and thereby will have a relatively large numeric aperture (NA>1.0).

In another embodiment, the aperture 208 could be positioned directly in the back focal plane of the objective 204. However, it will be appreciated that a camera system 210 would still be required for navigation. The beam splitter 206 could be removable or a removable mirror could be used to let light pass unfettered to the detector 212, wherein the beam splitter or mirror is moved into place during navigation. Alternatively, a movable, high reflectivity mirror could be positioned into the light path to direct the light towards the aperture and none to the camera during emission analysis. The mirror can be removed from the light path for navigation with the camera.

The aperture element 208 is optically coupled to a position-sensitive avalanche photodiode (APD) detector 212 with a coherent fiber optic bundle cable 214. The fiber optic cable 214 is a 0.002" glass fiber or, alternatively, a 0.012" diameter bundle of glass fibers, 0.55 NA. Commercially available products are suitable, such as the Fiber Optic Light Pipe with an FC connector and an opaque PVC sheathing from Micro Metrology Systems. A cable that provides transmission of coherent light is desirable to preserve the spatial relationship of the emitted light since the light is directed at a position-sensitive photon detector. The fiber optic cable must be shielded with material that does not permit penetration of external light to the light transmitting fiber.

The APD detector 212 of the example embodiment provides high efficiency photon detection, for example the C30927E series of quadrant APDs from EG&G CANADA are suitable. It will be appreciated that faster detectors can be used to analyze today's circuits in which devices, such as inverters, change state faster than 100 ps. In addition, as technology progresses and state changes occur at faster rates, even faster detectors can be used.

The quadrant APD 212 has four elements for detecting photons in which each of the elements is associated with one of the quadrants.

The placement of the aperture in the back focal plane of the objective and coupling the quadrant APD detector thereto with fiber optic cable effectively positions the detector in the focal plane of the objective. This provides enhanced spatial resolution that is limited only by the NA of the objective.

As device sizes continue to decrease, discerning photoemissions of one device from a second nearby device presents a significant challenge, particularly if the devices operate in parallel. When suitably aligned, the quadrant APD can be used to separately count photoemissions by quadrant or by x-y coordinates. X-y position analysis provides enhanced detector resolution. It will be appreciated that two-dimensional pixel APDs may be used in the future, and a single array 32-element APD, such as the model C30635E from EG&G could be used instead of a quadrant APD.

A time-to-amplitude converter 222 is coupled to the DUT 202 and to the APD detector 212. The converter 222 generates an output pulse whose amplitude is directly proportional to the time between the start and stop pulses from the detector 212 and the DUT 202, respectively. The APD detector 212 generates a start pulse each time a photon is detected, and the DUT 202 or tester provides a clock signal which the time-to-amplitude converter 222 uses as a stop pulse.

The output pulse from the converter 222 is digitized by a conventional analog-to-digital converter 224, and the digitized pulse is provided as input data to a computer 226 via a multi-channel analyzer (MCA) card. The input data represents the pulse height of the pulse output from the converter 222. The computer/MCA analyzes the digitized pulse height and increases the count of a histogram data point, where the data point is selected based on the pulse height. For example, the pulse height represents a time interval in which the photoemission was detected. Thus, the count for that time interval is incremented upon detection of a photoemission.

The time-to-amplitude converter is, for example, a model TC862 from Oxford. Other suitable converters include the Canberra model 2145.

In an alternative embodiment, a time-to-digital converter could be used in place of the time-to-amplitude converter 222 and ADC 224. An example time-to-digital converter is the model 1875 TDC that is available from Lecroy.

Quadrant APD detector 212 is also coupled to quadrant processor 227. Quadrant processor 227 counts pulses from each quadrant and outputs the counts by quadrant to computer 226. In one embodiment, quadrant processor 227 may be a discriminator/counter circuit such as that referenced in the paper, "Counting, timing, and tracking with a single-photon germanium detector" by F. Zappa et al., Optics Letters, Jan. 1, 1996, Vol. 21., No. 1. Alternatively, various x-y position analyzers, such as those from Quantar Technology, Inc., may be adapted for use in counting photons by position.

A test controller 228 is coupled to the DUT 202 for providing test signals as input. The test controller includes conventional hardware and software for configuring and loading test vectors in the DUT 202. The camera 210 is optionally included to provide navigation and a global view of the DUT 202. A suitable camera is Model SU 320 from Sensors Unlimited.

Figure 3:
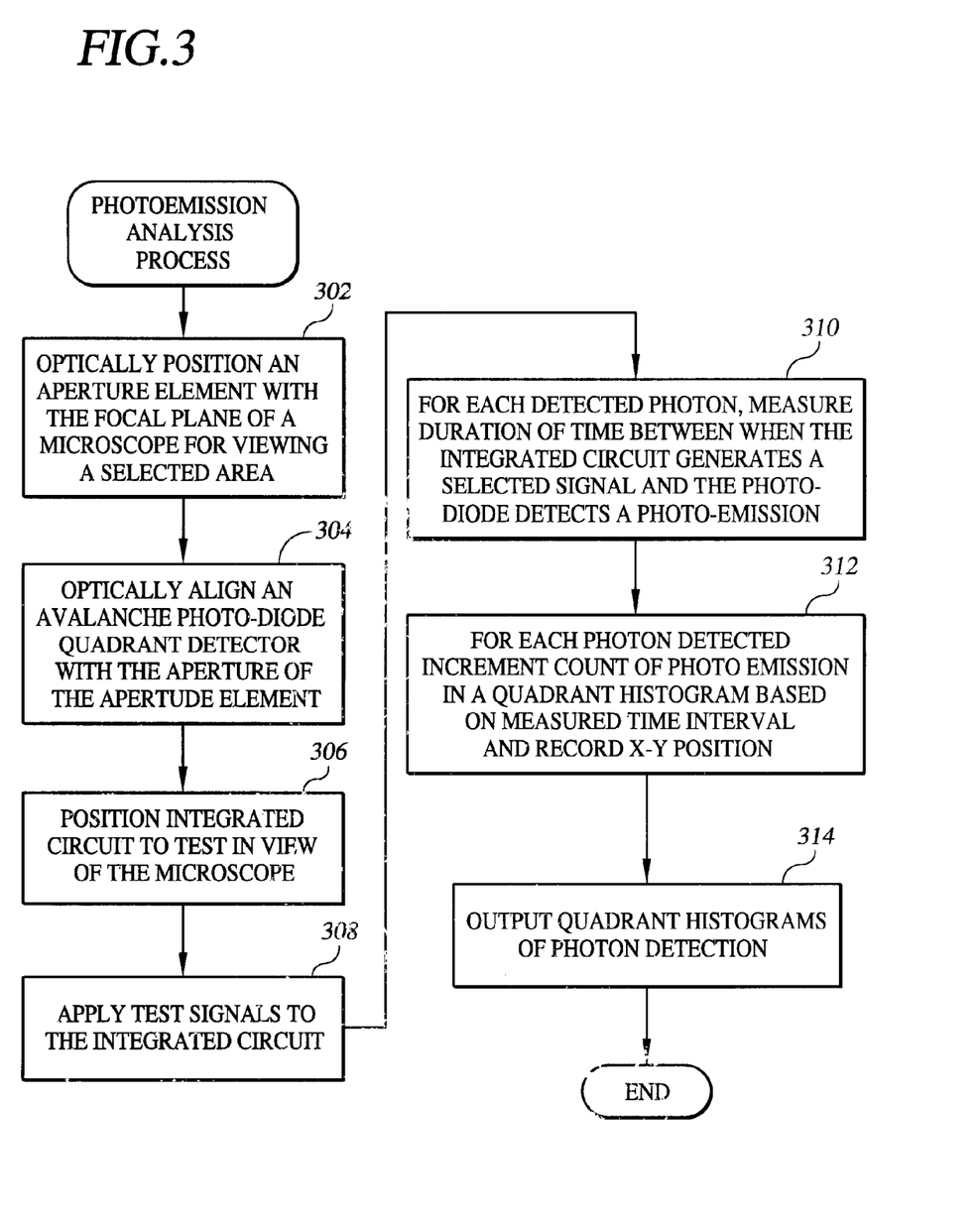
FIG. 3 is a flowchart of a process for quadrant time resolved analysis of photoemissions, according to an example embodiment of the invention.

FIG. 3 is a flowchart of a process for quadrant time resolved analysis of photoemissions, according to an example embodiment of the invention. At step 302, an aperture element 208 is positioned in the back focal plane of a microscope for viewing a selected area of a DUT 202. In the example embodiment of FIG. 2, this is effectively accomplished with the beam splitter 206. However, it will be appreciated that the aperture element 212 could also be physically placed in the back focal plane of the objective 204 without requiring a beam splitter.

At step 304, a quadrant APD detector 212 is aligned with the aperture 208. It will be appreciated that in the example embodiment of FIG. 2, this is effectively accomplished with the quadrant APD 212 along with the fiber optic cable 214. In another embodiment, the detector 212 could be physically aligned with the aperture 203.

The DUT 202 is positioned in view of the objective 204 at step 306 and brought into focus. Selected test signals are applied to the DUT by a test controller 228 at step 308.

At step 310, for each photon detected the duration of time between when a photon is detected and the time when the DUT generates a clock signal is measured. It will be appreciated that measurements are taken relative to photon detection in each quadrant of quadrant APD 212. At step 312, a count of photons detected is incremented in a quadrant histogram associated with the quadrant in which the photon was detected. In another embodiment, the x-y coordinates of the photons are also recorded. Conventional time-correlated single-photon-counting (TCSPC) techniques are used in the example embodiment.

Figure 4:
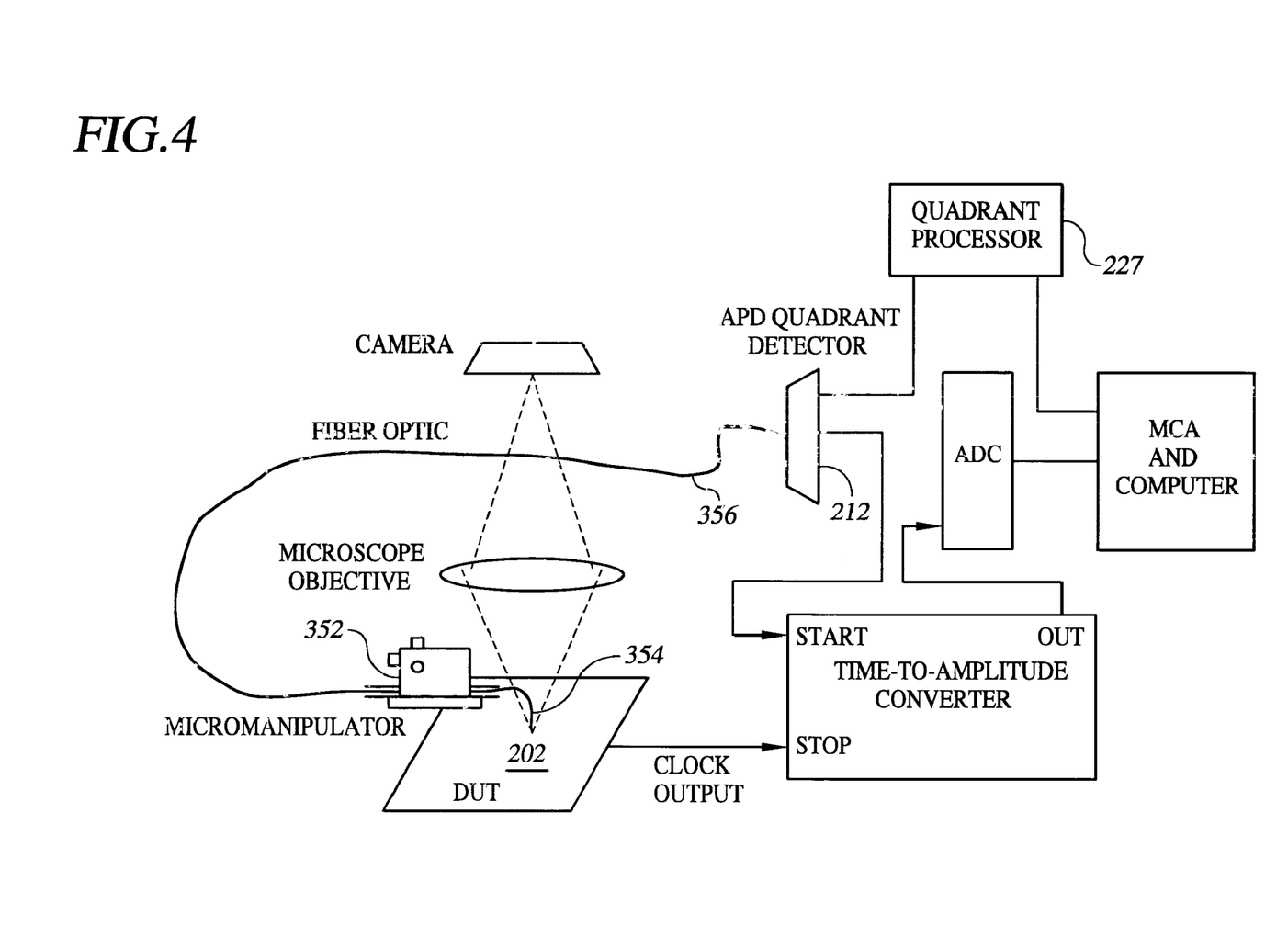
FIG. 4 is a block diagram of a system for quadrant time resolved photoemission detection, according to another example embodiment of the invention.

FIG. 4 is a block-diagram of a system for quadrant time resolved photoemission detection, according to another embodiment of the invention. The embodiment of FIG. 4 differs from that of FIG. 2 in that the beam splitter 206 and aperture element 208 are replaced with a micromanipulator 352. The micromanipulator 352 is movable about the area of the DUT 202 and includes a fiber optic probe 354 for capturing photoemissions from a selected area of the DUT.

The fiber optic probe 354 includes a metal tube (not shown) and an optical fiber threaded through the tube. The metal tube has a 90° bend to direct one end of the fiber toward the DUT 202, the other end of the tube being attached to the micromanipulator 352. The optic fiber of the probe 354 is coupled to the fiber optic cable 356 via the micromanipulator 352. Fiber optic cable that is comparable to cable 214 of FIG. 2 is suitable. An example micromanipulator is the model PH120 that is available from the Karl Suss company. Those skilled in the art will recognize comparable models that are available from other vendors which are suitable for the present invention.

FIGS. 5A–5D are graphs of example quadrant histograms of data generated in analyzing a hypothetical circuit in accordance with the embodiments described herein. The data of FIG. 5A correspond to quadrant 1, the data of FIG. 5B correspond to quadrant 2, the data of FIG. 5C correspond to quadrant 3, and the data of FIG. 5D correspond to quadrant 4. It will be appreciated that in another embodiment, an x-y processor can measure the current from the four quadrants and thereby determine more precisely the position of the photon.

Figure 5A:
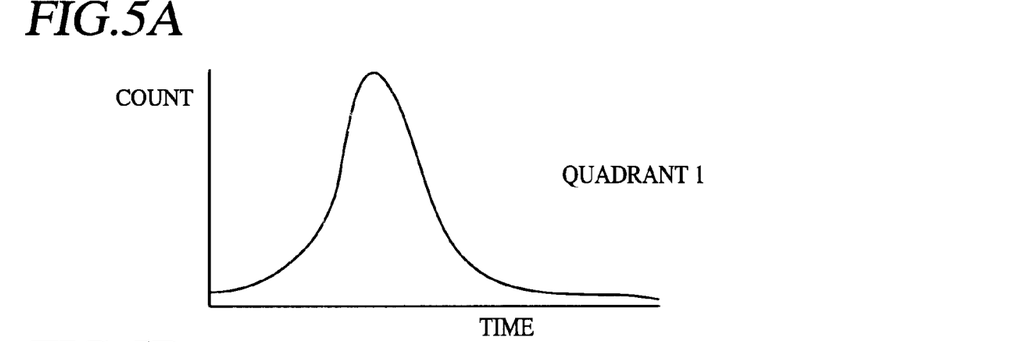
FIGS. 5A–5D are graphs of example quadrant histograms of data generated in analyzing a hypothetical circuit in accordance with the example embodiments described herein.
Figure 5B:
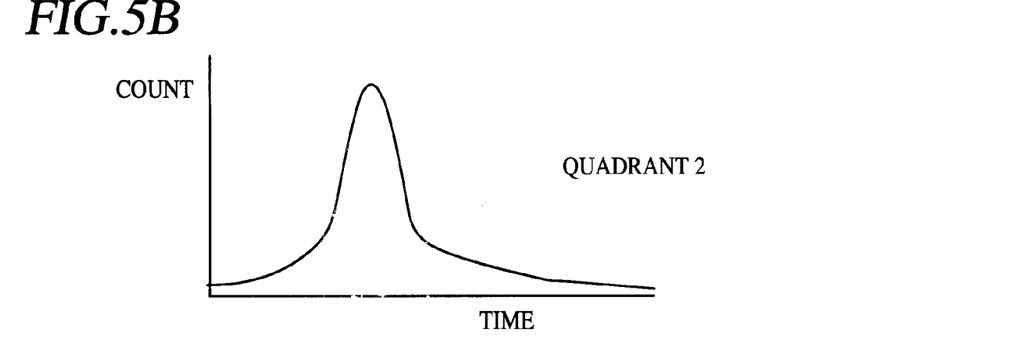

As illustrated in FIGS. 5A and 5B, peak photon counts in quadrants 1 and 2 are generally in the same time interval. If quadrant APD 212 is detecting photons emitted from a first device in quadrant 1 and photons emitted from a second device in quadrant 2, it appears that the two devices are switching in parallel.

Figure 5C:
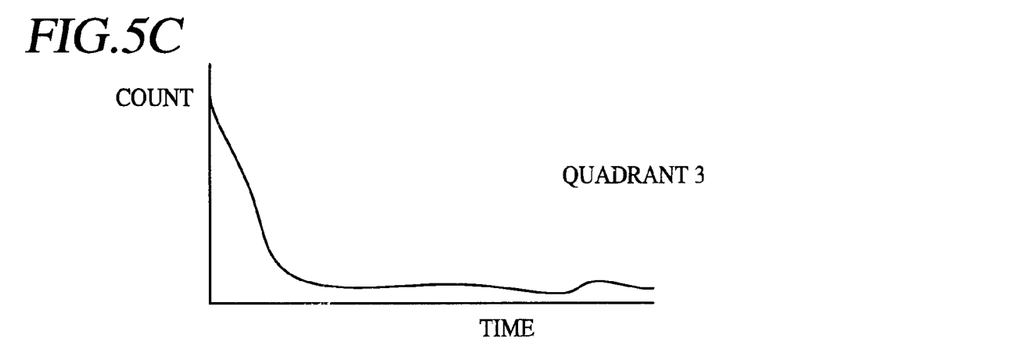
Figure 5D:
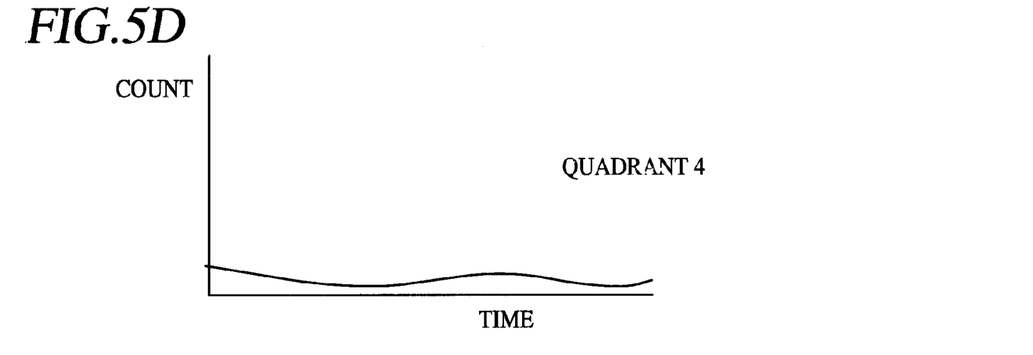

FIG. 5C illustrates a peak photon count occurring in quadrant in an interval that precedes the peak counts of quadrants 1 and 2. FIG. 5D illustrates that in quadrant 4 the photon count is relatively small over the illustrated interval.

Once photoemission data is collected, such as the example data of FIGS. 5A–D, timing specifications for the DUT can be analyzed and compared to the photoemission data to determine whether the circuit is functioning as expected.

Usage of conventional equipment in the example embodiments set forth above results in a system that is cost effective, yet highly functional. For example, instead of using a state-of-the-art camera for viewing the whole DUT 202, a quadrant APD detector 212 is used to detect photons over a small area of the DUT.

Figure 6A:
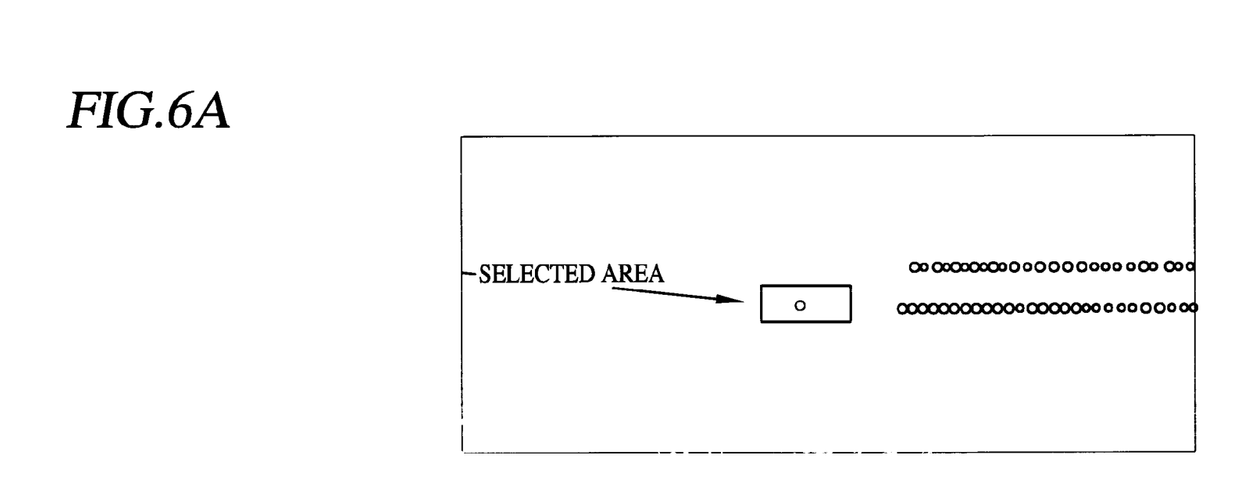
FIG. 6A is an example image of photoemissions from a device.

FIG. 6A is an example image of photoemissions from a sample DUT. It will be appreciated that the image represents the data collected over a selected time interval, wherein light spots depict the photoemissions from structures of the DUT.

Figure 6B:
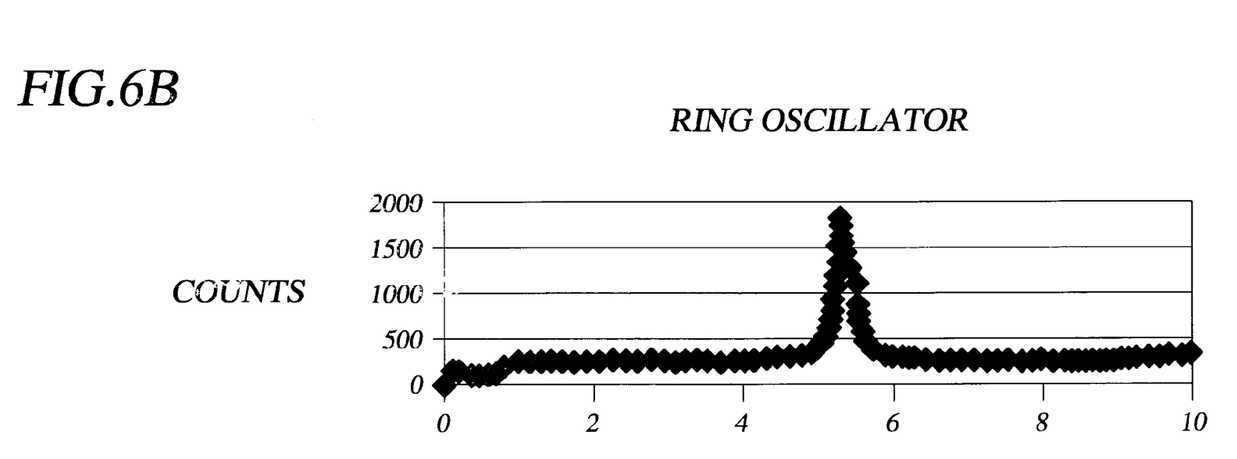
FIG. 6B is a histogram of data generated from a selected area of the image of FIG. 6A.

The white-outlined block represents an area of the DUT selected for further analysis. Specifically, upon selecting an area of the DUT defined by x-y coordinates, a further data view is presented, such as the histogram of FIG. 6B. For the selected area of FIG. 6A, FIG. 6B shows the photon count over a 10 ns interval.

As noted above, the present invention is applicable to analysis of a number of different semiconductor structures and arrangements. Furthermore, the invention may be implemented in various forms using equipment that is comparable to that identified herein. Accordingly, the present invention should not be considered limited to the particular examples described above, but rather should be understood to cover all aspects of the invention as fairly set out in the attached claims. Various modifications, equivalent structures, as well as numerous structures to which the present invention may be applicable will be readily apparent to those of skill in the art upon review of the present specification. The claims are intended to cover such modifications and devices.

What is claimed is:

1. An apparatus for analyzing an integrated circuit to which test signals are applied, comprising:
    a microscope having an objective lens forming a back focal plane and arranged to view the integrated circuit;
    an aperture element having an aperture optically aligned in the back focal plane of the microscope and positioned for viewing a selected area of the integrated circuit; and
    a position-sensitive avalanche photo-diode optically aligned with the aperture.

2. The apparatus of claim 1, wherein the position-sensitive avalanche photo-diode is a quadrant avalanche photo-diode.

3. The apparatus of claim 1, wherein the position-sensitive avalanche photo-diode is a two-dimensional pixel avalanche photo-diode.

4. The apparatus of claim 1, further comprising a timer circuit coupled to the avalanche photo-diode, and arranged to couple to the integrated circuit to provide an output signal indicative of time expired between occurrence of a signal from the integrated circuit and a signal from the quadrature avalanche photo-diode.

5. The apparatus of claim 4, wherein the timer circuit is a time-to-amplitude converter.

6. The apparatus of claim 4, further comprising a computer coupled to the timer circuit, and configured and arranged to record the output signal.

7. The apparatus of claim 5, further comprising a processor coupled to the avalanche photo-diode and to the computer, the processor configured and arranged to detect respective coordinates of photoemissions.

8. The apparatus of claim 1, further comprising a beam splitter disposed behind the objective lens and arranged to direct light from the integrated circuit to the aperture.

9. The apparatus of claim 8, wherein the beam splitter is a cube-type beam splitter.

10. The apparatus of claim 8, further comprising fiber optic cable optically aligned coaxial with the aperture and the avalanche photo-diode.

11. The apparatus of claim 1, further comprising an analog-to-digital converter coupled between the timer and the computer.

12. The apparatus of claim 11, further comprising a multi-channel analyzer board coupled to the analog-to-digital converter.

13. The apparatus of claim 1, wherein the microscope includes a near infrared microscope objective.

14. The apparatus of claim 13, wherein the aperture element is a circular aperture having an opening that matches the diameter of the detector.

15. A process for analyzing an integrated circuit with a microscope having a focal plane behind an objective lens, comprising the steps of:
    placing an aperture element having an aperture in the focal plane of the objective lens of the microscope and positioning the aperture for viewing a selected area of the integrated circuit;
    optically aligning a position-sensitive avalanche photo-diode with the aperture;
    placing an integrated circuit in view of the microscope;
    applying signals to the integrated circuit; and
    detecting a photo-emission from the selected area of the integrated circuit.

16. The process of claim 15, further comprising, repeating the steps of claim 13 for a selected period of time and recording time-relative counts of photons for respective positions of the photo-emissions.

17. The process of claim 15, further comprising:
    detecting respective x-y coordinates of photoemissions; and
    recording respective counts of photoemissions for the x-y coordinates.

18. The process of claim 15, wherein the integrated circuit has a front side and a back side, and the back side is exposed for viewing with the microscope.

19. The process of claim 15, further comprising the step of measuring a duration of time between occurrence of a selected output signal from the integrated circuit and an output signal from the avalanche photo-diode.

20. The process of claim 19, further comprising the step of generating a voltage at a level proportional to the duration of time between when a selected signal is output from the integrated circuit and the avalanche photo-diode outputs a signal.

21. The process of claim 20, further comprising the step of coupling the avalanche photo-dioide and the integrated circuit to a time-to-amplitude converter.

22. The process of claim 21, further comprising the step of coupling the time-to-amplitude converter to an analog-to-digital converter and coupling the analog-to-digital converter to a computer.

* * * * *